METHOD OF PRODUCING GALLIUM ARSENIDE DEVICES

Filed Jan. 9, 1968 2 Sheets-Sheet 1

Inventor
GEORGE R. ANTELL
By [signature]
Attorney

Sept. 22, 1970 G. R. ANTELL 3,530,014

METHOD OF PRODUCING GALLIUM ARSENIDE DEVICES

Filed Jan. 9, 1968 2 Sheets-Sheet 2

Inventor
GEORGE R. ANTELL
By [signature]
Attorney

3,530,014
METHOD OF PRODUCING GALLIUM ARSENIDE DEVICES

George Richard Antell, Saffron Walden, England, assignor to International Standard Electric Corporation, New York, N.Y., a corporation of Delaware Filed Jan. 9, 1968, Ser. No. 696,519
Claims priority, application Great Britain, Jan. 13, 1967, 1,851/67
Int. Cl. H01l 7/44
U.S. Cl. 148—187 10 Claims

ABSTRACT OF THE DISCLOSURE

A method of manufacturing gallium arsenide PIN diodes by diffusing oxygen, a deep acceptor, through an oxygen permeable layer into an N-type epitaxial gallium arsenide layer, thus forming an intrinsic region, and then forming a P-type layer on or in the intrinsic region.

BACKGROUND OF THE INVENTION

Figure 1A:
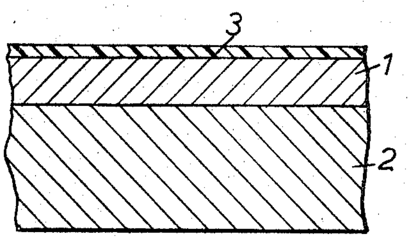

This invention relates to a method for producing gallium arsenide devices.

Oxygen has heretofore been considered as a deep donor in gallium arsenide and would therefore be expected to produce intrinsic, i.e. high resistivity or semi-insulating material if diffused into P-type gallium arsenide.

Studies on PN junctions containing oxygen suggested that oxygen is an amphoteric impurity, i.e. to have both donor an acceptor properties.

The present invention enables gallium arsenide devices to be fabricated starting with N-type material by diffusing in oxygen through an oxygen permeable layer wherein the oxygen acts as a deep acceptor and forms an intrinsic region extending from the diffusion surface.

The oxygen permeable layer is preferably silica, although the composition may vary from $SiO_2$. The conversion of the N-type body to intrinsic material occurs only under that area of the body masked by the oxygen permeable layer. No conversion results at other, unmasked parts of the body. It is believed that, with the unmasked areas, oxygen combines with the gallium and arsenic to form the respective oxides which then evaporate due to the elevated temperature at which the diffusion takes place.

Water vapour is the preferred source of the oxygen for diffusion. It is believed that the oxygen passes through the masking layer in —OH groups, and possibly diffuses into the body in this form. The presence of hydrogen has no effect on the body.

SUMMARY OF THE INVENTION

According to the invention there is provided a method of producing a region of intrinsic gallium arsenide in a body of N-type conductivity gallium arsenide, which method includes the steps of providing an oxygen permeable layer on a surface of the N-type body and then causing oxygen to permeate through the oxygen permeable layer and diffuse into the underlying surface of the body.

IN THE DRAWINGS

FIGS. 1*a* to 1*f* show successive stages in the production of a gallium arsenide PIN mesa diode, and FIGS. 2*a* to 2*e* show successive stages in the production of a gallium arsenide PIN planar diode.

DETAILED DESCRIPTION

Referring to FIG. 1*a*, the starting material is a slice comprising an N-type layer 1 of gallium arsenide, doped in the region of $10^{16}$ cm.$^{-3}$ and about 20 microns thick, preferably an epitaxial layer, on an $N^+$ gallium arsenide substrate 2 ($\sim 10^{18}$cm.$^{-3}$). After suitable cleaning, a layer of silica 3 about 2,000 A. thick is deposited on the layer 1.

The oxygen is most conveniently introduced into the layer 1 by carrying out the diffusion in the presence of water vapour. This water vapour can come from the quartz used in the diffusion capsule or from a suitable gas such as argon which contains water vapour if diffusion is carried out in an open tube system.

Figure 1B:
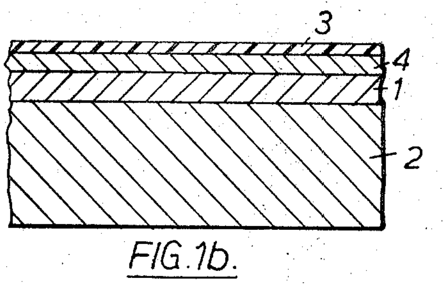

The penetration of oxygen after 5 hours at 900° C. in a sealed synthetic quartz capsule is up to about 15 microns, resulting in an intrinsic layer 4 (FIG. 1*b*).

Figure 1C:
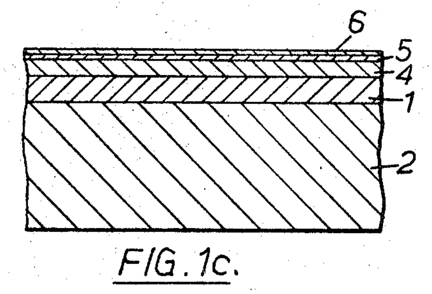
Figure 1D:
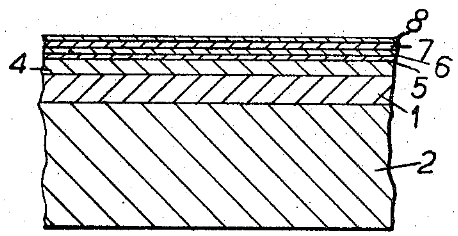

As shown in FIG. 1*c*, a $P^+$ contact to the layer 4 is formed by first evaporating a thin layer 5 of say 200–500 A. of 2% zinc remainder gold which is then alloyed with the slice at a temperature of 500–600° C. wherein the acceptor impurity zinc diffuses into the intrinsic region.

After evaporation the slice is cooled quickly and at about 250° C., a layer 6 of pure gold, 3000–4000 A. is deposited.

Subsequently, a layer 7 (FIG. 1*d*) of nickel, 1000 A., is deposited by electroless plating, followed by a layer 8 of gold of about 500 A. to prevent the nickel oxidizing.

Figure 1E:
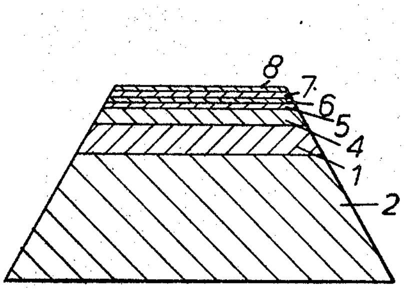

Mesas are cut out of the slice by any suitable means to form individual mesa diodes such as shown in FIG. 1*e*. Each diode is given a light etch to remove damage, and mounted in any suitable form of encapsulation such as that shown in FIG. 1*f*.

Figure 1F:
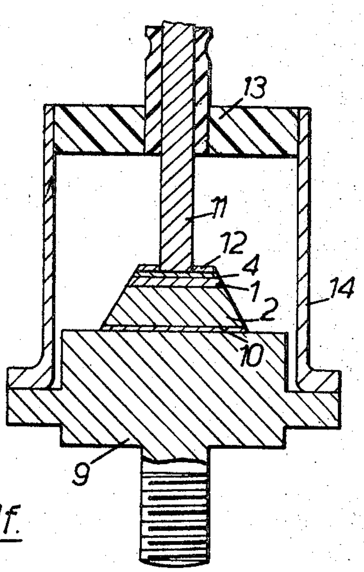

In FIG. 1*f*, there is a copper base 9 to which the substrate 2 is soldered using lead solder 10. The $P^+$ contact side of the slice is soldered to a silver lead-out conductor 11 by lead solder 12. The conductor 11 is sealed through a metal-to-glass seal 13 in a flanged metal can 14 which encloses the PIN diode and is flange fastened to the base.

In the production of a planar PIN diode, the starting material is a slice comprising an N-type layer 20 (FIG. 2*a*) of gallium arsenide, doped in the region of $10^{16}$ cm.$^{-3}$ and about 20 microns thick, preferably an expitaxial layer, on an $N^+$ gallium arsenide substrate 21 ($\sim 10^{18}$ cm.$^{-3}$).

After suitable cleaning, a layer of silica about 2,000 A. thick is deposited on the layer 20. By photoresist techniques some of the silica is removed to leave islands 22 of silica. A further layer 23 (FIG. 2*b*) of silica about 2,000 A. thick is deposited over the surface of layer 20 and the islands 22 giving a total thickness on the islands of 4,000 A.

Oxygen is diffused as already described.

Figure 2A:
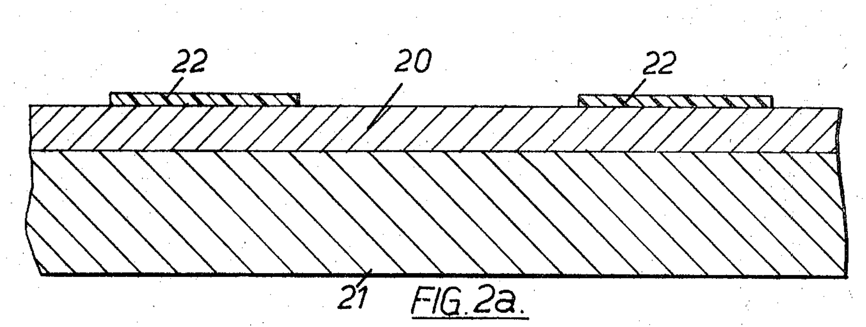
Figure 2B:
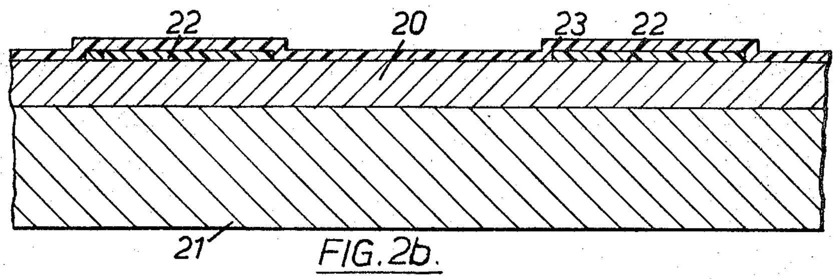
Figure 2C:
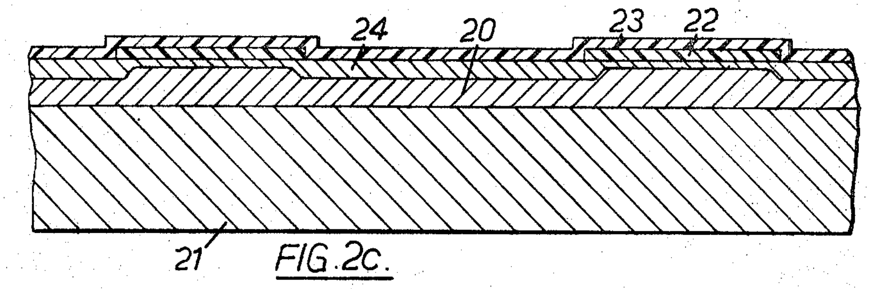

The penetration of oxygen is less under the islands as shown in FIG. 2*c* in which the thickness of the intrinsic region 24 is less under the islands. Breakdown under reverse voltage will take place in this thinner region.

Figure 2D:
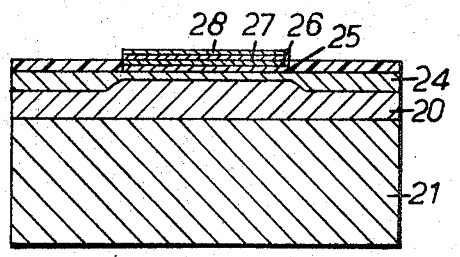

Individual diodes such as shown in FIG. 2*d* are cut from the slice by any suitable means, and a $P^+$ contact to the layer 20 is formed as previously described, i.e. a gold=2% zinc layer 25, a pure gold layer 26, an electroless nickel layer 27 and a gold layer 28.

Figure 2E:
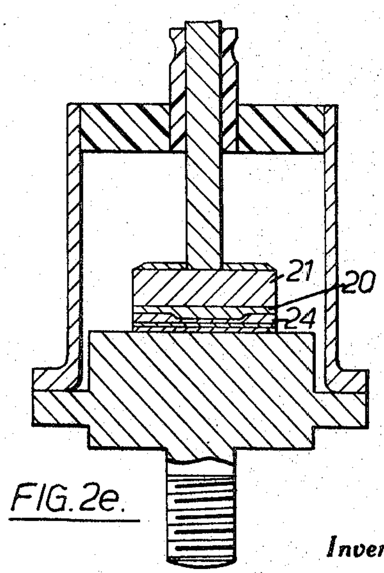

Each diode is given a light etch to remove damage and mounted in any suitable form of encapsulation, such as that shown in FIG. 2*e* and identical to the encapsulation shown in FIG. 1*f*, again using lead solder. Further description of this figure is not considered necessary, except to point out that the planar PIN diode is mounted with the junction against the copper base heat sink which is an advantage in heat dissipation since gallium arsenide is a much poorer thermal conductor than silicon. This enables the production of high power gallium arsenide PIN diodes that will operate at higher temperatures than with silicon.

The thickness of the intrinsic region can be controlled by the thickness of the epitaxial layer on the $N^+$ substrate provided that this thickness is less than the depth of penetration of the oxygen. The oxygen converts the lightly doped epitaxial layer to intrinsic material, but scarcely effects the more heavily doped $N^+$ substrate.

While the principles of the invention have been described above in connection with specific embodiments, and particular modifications thereof, it is to be clearly understood that this description is made only by way of example and not as a limitation on the scope of the invention.

I claim:

1. A method of producing a region of intrinsic gallium arsenide in a body of N-type conductivity gallium arsenide, comprising the steps of:
- providing an oxygen permeable layer on a surface of the N-type body;
- causing oxygen to permeate through said oxygen permeable layer;
- and diffusing said oxygen into the underlying surface of said body.

2. A method as claimed in claim 1 in which the oxygen diffusion is carried out by heating said body in an oxygen containing atmosphere.

3. A method as claimed in claim 2 in which said oxygen permeable layer is silica.

4. A method as claimed in claim 2 in which said oxygen containing atmosphere is water vapour.

5. A method as claimed in claim 4 in which said body is heated in a sealed capsule of synthetic quartz.

6. A method as claimed in claim 1 in which the N-type body comprises an epitaxial layer of gallium arsenide on a substrate of $N^+$ gallium arsenide.

7. A method as claimed in claim 6 in which the thickness of said epitaxial layer is less than the intended depth of diffusion of said oxygen.

8. A method as claimed in claim 1 in which said oxygen permeable layer is provided on the surface of the N-type body so as to be thicker at spaced areas thereon then elsewhere on the surface, whereby the depth of diffusion of said oxygen is less under said spaced areas than elsewhere into the surface of said body.

9. A method of manufacturing a gallium arsenide semiconductor device comprising the steps of:
- providing an oxygen permeable layer on a surface of a body of N-type conductivity gallium arsenide;
- causing oxygen to permeate through said oxygen permeable layer;
- diffusing said oxygen into the underlying surface of said body, thereby forming an intrinsic region in said body;
- and forming a layer P-type gallium arsenide in said intrinsic region.

10. A method as claimed in claim 9 in which said P-type layer is formed by diffusing zinc into said intrinsic region.

References Cited

UNITED STATES PATENTS

| | | | |
|---|---|---|---|
| 3,261,080 | 7/1966 | Grimmeiss et al. | 317—237 |
| 3,313,663 | 4/1966 | Yeh et al. | 148—187 |
| 3,365,630 | 1/1968 | Logan et al. | 317—237 |
| 3,370,209 | 2/1968 | Davis et al. | 317—235 |
| 3,413,506 | 11/1968 | Cuthbert et al. | 317—235 |

L. DEWAYNE RUTLEDGE, Primary Examiner

R. A. LESTER, Assistant Examiner

U.S. Cl. X.R.

29—578; 148—175, 188; 317—235, 237